US007384827B2

(12) United States Patent
Abe (10) Patent No.: US 7,384,827 B2
(45) Date of Patent: Jun. 10, 2008

(54) METHOD OF MANUFACTURING SEMICONDUCTOR DEVICE USING LIQUID PHASE DEPOSITION OF AN INTERLAYER DIELECTRIC

(75) Inventor: Daisuke Abe, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/088,973

(22) Filed: Mar. 24, 2005

(65) Prior Publication Data

US 2005/0233575 A1    Oct. 20, 2005

(30) Foreign Application Priority Data

Apr. 16, 2004  (JP)  ............... 2004-122050
Jul. 14, 2004  (JP)  ............... 2004-206954

(51) Int. Cl.
*H01L 21/311*  (2006.01)

(52) U.S. Cl. .............. 438/149; 438/167; 438/692; 257/E21.237; 257/E21.243; 257/E21.413; 257/E21.535

(58) Field of Classification Search .......... 438/149, 438/167, 692, FOR. 111, FOR. 201; 257/E21.237, 257/E21.243, E21.413, E21.535
See application file for complete search history.

(56) References Cited

U.S. PATENT DOCUMENTS

| 4,735,679 | A | * | 4/1988 | Lasky | ............... | 438/759 |
| 5,683,941 | A | * | 11/1997 | Kao et al. | ............... | 438/592 |
| 5,763,931 | A | * | 6/1998 | Sugiyama | ............... | 257/506 |
| 5,843,834 | A | * | 12/1998 | Naem | ............... | 438/564 |
| 5,885,887 | A | * | 3/1999 | Hause et al. | ............... | 438/564 |

(Continued)

FOREIGN PATENT DOCUMENTS

| JP | A 2000-040828 | 2/2000 |
| JP | A-2003-298065 | 10/2003 |

OTHER PUBLICATIONS

Ichirou Asai, Noriji Kato, Mario Fuse and Toshihisa Hamano; "Poly-Silicon Thin-Film Transistors With Uniform Performance Fabricated by Excimer Laser Annealing"; Jpn. J. Appl. Phys. vol. 32 (1993); pp. 474-481; Part 1, No. 1B; Jan. 1993.

*Primary Examiner*—George Fourson
(74) *Attorney, Agent, or Firm*—Oliff & Berridge, PLC (57) ABSTRACT

Exemplary embodiments of the invention provide techniques that enable avoidance of the concentration of an electric field at the edge of a semiconductor film in a semiconductor device such as a thin film transistor, thereby enhancing the reliability. Exemplary embodiments provide a method of manufacturing a semiconductor device using a structure in which a semiconductor film, a dielectric film, and an electrode are deposited. The method of manufacturing a semiconductor device includes: forming an island-shape semiconductor film on one dielectric surface of a substrate, the substrate having at least one dielectric surface; forming a first dielectric film on the one surface of the substrate so as to cover the semiconductor film and have a film thickness of the portion other than over the semiconductor film equal to or larger than that of the semiconductor film; reducing a film thickness of the first dielectric film at least in a region over the semiconductor film; and forming an electrode so as to be on the first dielectric film after reduction of the film thickness and pass over a predetermined location of the semiconductor film.

6 Claims, 7 Drawing Sheets

U.S. PATENT DOCUMENTS

| | | | |
|---|---|---|---|
| 5,928,960 A * | 7/1999 | Greco et al. | 438/692 |
| 5,930,634 A * | 7/1999 | Hause et al. | 438/307 |
| 5,966,597 A * | 10/1999 | Wright | 438/197 |
| 5,994,199 A * | 11/1999 | Sugiyama | 438/404 |
| 6,060,387 A * | 5/2000 | Shepela et al. | 438/630 |
| 6,060,783 A * | 5/2000 | Juengling et al. | 257/752 |
| 6,074,921 A * | 6/2000 | Lin | 438/299 |
| 6,080,646 A * | 6/2000 | Wang | 438/585 |
| 6,180,510 B1 * | 1/2001 | Hayashi | 438/626 |
| 6,194,253 B1 * | 2/2001 | Bolam et al. | 438/149 |
| 6,258,651 B1 * | 7/2001 | Jenq et al. | 438/238 |
| 6,265,315 B1 * | 7/2001 | Lee et al. | 438/692 |
| 6,558,994 B2 * | 5/2003 | Cha et al. | 438/163 |
| 6,815,353 B2 * | 11/2004 | Schlupp et al. | 438/691 |
| 6,818,536 B2 | 11/2004 | Ipposhi et al. | |
| 2004/0147076 A1 * | 7/2004 | Chen et al. | 438/257 |
| 2004/0266077 A1 * | 12/2004 | Yeo et al. | 438/157 |
| 2005/0056881 A1 * | 3/2005 | Yeo et al. | 257/315 |

* cited by examiner

METHOD OF MANUFACTURING SEMICONDUCTOR DEVICE USING LIQUID PHASE DEPOSITION OF AN INTERLAYER DIELECTRIC

BACKGROUND

Exemplary embodiments of the present invention relate to enhanced techniques of a field effect type semiconductor device such as a metal oxide semiconductor (MOS) transistor.

The related art includes research and development of techniques to form a thin film transistor with high current drive capability that uses a crystalline semiconductor film (such as a polysilicon film) formed by low-temperature processes. An amorphous silicon film is crystallized by the application of laser beams, and therefore a polysilicon film is formed. The polysilicon film formed in this way, however, has a tendency to grow boundaries between crystal grains in various places in crystallizing (grain boundaries) that rise and become protrusion-like shapes, and therefore the unevenness of the surface becomes large. In a field effect thin film transistor wherein a gate dielectric film and a gate electrode are formed on or above this polysilicon film, an electric field concentrates at protrusions on the surface of the polysilicon film, and therefore a dielectric breakdown is likely to occur in the gate dielectric film. Related art document Japanese Unexamined Patent Publication No. 2000-40828 discloses the technique that, after forming a polysilicon film, its surface is planarized by polishing to avoid the dielectric breakdown of a gate dielectric film in a thin film transistor.

When the film thickness of a gate dielectric film is made thinner in order to promote miniaturization of a thin film transistor, the gate dielectric film is likely to have a thin film thickness at the edge of a semiconductor film. This tendency is notable when the gate dielectric film is formed using the film formation method with low step coverage such as a sputtering method or a chemical vapor deposition (CVD) method. If the gate electrode is formed to cross this edge, an electric field concentrates at the portion of crossing, thereby often leading to a dielectric breakdown. This causes a disadvantage that the reliability of a thin film transistor decreases. It is difficult in the above described related art technique to accomplish the decrease of the concentration of the electric field at the edge of the semiconductor film, and therefore further enhanced techniques have been desired.

SUMMARY

Exemplary aspects of the present invention are intended to provide techniques that enable avoidance of the concentration of the electric field at the edge of a semiconductor film in a semiconductor device such as a thin film transistor to enhance the reliability.

The present invention in a first exemplary aspect is a method of manufacturing a semiconductor device using a structure in which a semiconductor film, a dielectric film, and an electrode are deposited, such as a metal insulator semiconductor (MIS) structure and a MOS structure. The method of manufacturing a semiconductor device includes: a first process of forming an island-shape semiconductor film on one dielectric surface of a substrate, the substrate having at least one dielectric surface; a second process of forming a first dielectric film on the one surface of the substrate so as to cover the semiconductor film and have a film thickness of the portion other than over the semiconductor film equal to or larger than that of the semiconductor film; a third process of reducing a film thickness of the first dielectric film at least in a region over the semiconductor film; and a fourth process of forming an electrode so as to be on the first dielectric film after reduction of the film thickness and pass over a predetermined location of the semiconductor film.

In this manufacturing method, the first dielectric film is formed to be a thick film such that a film thickness of its portion corresponding to the surroundings of the semiconductor film is sufficiently secured, and then a film thickness of its portion that is above the semiconductor film is adjusted to a desired film thickness for the convenience of device characteristics. It therefore becomes possible to avoid the concentration of an electric field at the edge of the semiconductor film in the semiconductor device without damaging the characteristics necessary as a semiconductor device, thereby enhancing the reliability.

Preferably the second process applies and solidifies a liquid material to form the first dielectric film.

Adoption of a film formation method using a liquid material facilitates forming the first dielectric film to be a thick film.

Preferably exemplary embodiments of the present invention further include, prior to the fourth process, a fifth process of forming a second dielectric film on the first dielectric film, the fourth process forming the electrode on the second dielectric film.

As a result, functions can be separated such that the second dielectric film mainly has dielectric film characteristics necessary for obtaining the required device characteristics while the first dielectric film mainly has a function of insulating the edge portion of the semiconductor film from the electrode. Accordingly, it becomes possible to select more suitable conditions for forming the first dielectric film to be a thick film and select more suitable conditions of film formation to secure required characteristics for the second dielectric film. As such, there is an advantage of extending the range of choices for manufacturing processes.

Preferably the third process reduces the film thickness of the first dielectric film until the top surface of the semiconductor film is exposed, and the fifth process forms the second dielectric film such that the exposed top surface of the semiconductor film is covered. As a result, a dielectric film formed on the top surface of the semiconductor film, namely a dielectric film particularly related to the device characteristics, is only the second dielectric film, further facilitating the set of manufacturing conditions for securing required characteristics.

Preferably the third process reduces the film thickness of the first dielectric film by planarizing the unevenness of the top surface of the semiconductor film. As a result, it becomes easier to avoid the decrease of insulation resistance due to the concentration of an electric field in the top surface of the semiconductor film. Planarization of the unevenness permits making a thinner film thickness of the later formed second dielectric film.

Preferably the third process is performed by chemical mechanical polishing. As a result, the process of reducing the film thickness can be performed easily, which is particularly advantageous when planalizing the unevenness of the top surface of the semiconductor film.

Preferably the semiconductor film is a polycrystalline semiconductor film (such as polysilicon film).

The manufacturing method according to exemplary embodiments of the present invention is effective particularly when employing a polycrystalline semiconductor film as the semiconductor film, obtaining a semiconductor device that has good reliability.

Exemplary embodiments of the present invention in a second exemplary aspect is a method of manufacturing a semiconductor device using a structure in which a semiconductor film, a dielectric film, and an electrode are deposited. The manufacturing method includes: a first process of forming a first dielectric film that has an opened region for forming a semiconductor film on one dielectric surface of a substrate, the substrate having at least one dielectric surface; a second process of forming a semiconductor film on the one surface of the substrate so as to bury at least the opening of the first dielectric film; and a third process of reducing a film thickness of at least the semiconductor film such that the top surface of the first dielectric film and the top surface of the semiconductor film are flush with each other.

In this manufacturing method, the semiconductor film and a (element isolation) dielectric film are formed such that their top surfaces are flush with each other, or such that the semiconductor film and the (element isolation) dielectric film have the same film thicknesses. Accordingly, a gate dielectric film or the like on the top surface and at the edge of the semiconductor film in later processes can be formed to be planarized, and therefore lowering of the step coverage at the edge of the related art semiconductor film can be avoided. The concentration of the electric field at the edge of the semiconductor film can be therefore avoided to enhance the reliability.

Preferably exemplary embodiments of the present invention in a second exemplary aspect further includes a fourth process of forming a second dielectric film on the semiconductor film, and a fifth process of forming an electrode so as to be on the first dielectric film and pass over a predetermined location of the semiconductor film.

As a result, the gate dielectric film (second dielectric film) can be formed to be planarized on the semiconductor film and element isolation dielectric film, enabling elimination of the portions where electric fields concentrate in the semiconductor film and gate dielectric film, and therefore the transistor characteristics are enhanced and the reliability of the gate dielectric film also is enhanced. There is also an advantage that the processes with low step coverage such as sputtering and electron cyclotron resonance CVD (ECR-CVD) become applicable as methods for forming the gate dielectric film.

Preferably the third process is performed by chemical mechanical polishing. As a result, the process of reducing the film thickness can be performed easily. The third process performed by chemical mechanical polishing is particularly advantageous when planalizing the unevenness of the top surface of the semiconductor film.

Exemplary embodiments of the present invention in a third exemplary aspect relating to a semiconductor device manufactured by the manufacturing methods according to the above exemplary embodiments of the invention, comprising the following structure.

That is, exemplary embodiments of the present invention in a third exemplary aspect is a field effect semiconductor device using a structure in which a semiconductor film, a dielectric film, and an electrode are deposited. The semiconductor device includes: an island-shape semiconductor film formed on a substrate having at least one dielectric surface; a first dielectric film formed on the one surface of the substrate so as to enclose the semiconductor film and expose a top surface of the semiconductor film; a second dielectric film formed on the first dielectric film so as to cover the top surface of the semiconductor film; and an electrode formed so as to be on the second dielectric film and pass over a predetermined location of the semiconductor film.

This structure makes it possible to avoid the concentration of an electric field at the edge of the semiconductor film in the semiconductor device without damaging the characteristics required as a semiconductor device, thereby enhancing the reliability. There is also an advantage that functions can be separated such that the second dielectric film mainly has characteristics of a dielectric film necessary for obtaining the required device characteristics while the first dielectric film mainly has a function of insulating the edge portion of the semiconductor film from the electrode. As a result of this function separation, a dielectric film formed on the top surface of the semiconductor film, namely a dielectric film particularly related to the device characteristics, is only the second dielectric film, further facilitating the device design for securing required characteristics.

Preferably the first dielectric film and the semiconductor film are formed to have nearly the same film thicknesses. As a result, it becomes possible to form the second dielectric film on the planarized surface, which further facilitates making the second dielectric film thinner.

Preferably the first dielectric film and the semiconductor film are formed such that their top surfaces are substantially flush with each other. As a result, it becomes possible to form the second dielectric film on the planarized surface, which further facilitates making the second dielectric film thinner.

Preferably the first dielectric film and the second dielectric film are made from different materials. As a result, each dielectric film can be formed by selecting a material according to its required characteristics.

Preferably the semiconductor film is a polycrystalline semiconductor film.

Exemplary embodiments of the present invention in a fourth exemplary aspect relates to a semiconductor device manufactured by the manufacturing methods according to the above exemplary embodiments of the invention, having the following structure.

That is, exemplary embodiments of the present invention in a fourth exemplary aspect is a field effect semiconductor device using a structure in which a semiconductor film, a dielectric film, and an electrode are deposited. The semiconductor device including an island-shape semiconductor film formed on the substrate having at least one dielectric surface; a first dielectric film formed on the one surface of the substrate so as to cover the semiconductor film and have a first film thickness, which corresponds to the region other than that over the semiconductor film, equal to or larger than the film thickness of the semiconductor film, as well as a second film thickness, which corresponds to the region over the semiconductor film, smaller than the first film thickness; and an electrode formed so as to be on the first dielectric film and pass over a predetermined location of the semiconductor film.

This structure makes it possible to avoid the concentration of an electric field at the edge of the semiconductor film in the semiconductor device without damaging the characteristics required as a semiconductor device, thereby enhancing the reliability.

Preferably exemplary embodiments of the present invention in a fourth exemplary aspect further includes a second dielectric film formed on the first dielectric film, the electrode being formed on the second dielectric film. As a result, it becomes possible to further increase the insulation between the semiconductor film and the electrode.

Preferably the first dielectric film and the second dielectric film are made from different materials. As a result, each dielectric film can be formed by selecting a material according to the required characteristics.

Preferably the semiconductor film is a polycrystalline semiconductor film.

Exemplary embodiments of the present invention in a fifth exemplary aspect is an integrated circuit including a semiconductor device according to the above exemplary embodiments of the invention. "Integrated circuit", as the term is used herein, means a circuit in which a semiconductor device and related wiring are integrated and interconnected to perform a predetermined function (chip). In exemplary embodiments of the present invention, this chip can also provide circuit substrates located at one or a plurality of predetermined places on the substrate.

Exemplary embodiments of the present invention in a sixth exemplary aspect is an electro-optic device including a semiconductor device according to exemplary embodiments of the above invention. "Electro-optic device", as the term is used herein, means a device in general including an electro-optic element that emits light or changes the state of light from the outside by electrical action, having a semiconductor device according to exemplary embodiments of the present invention, which includes both one that emits light for oneself and one that controls passage of light from the outside. This means, for example, an active matrix type display device that includes, as electro-optic elements, a liquid crystal element, an electrophoretic element having a dispersion medium in which electrophoretic particles are dispersed, electroluminescence (EL) element, and an electron emission element that applies to a light-emitting plate electrons emitted by the application of an electric field and emits light.

Exemplary embodiments of present invention in a seventh exemplary aspect is electronic equipment including a semiconductor device according to the exemplary embodiments of the above invention. "Electronic equipment", as the term is used herein, means equipment in general that performs regular functions and has a semiconductor device according to exemplary embodiments of the present invention, being constructed, for example, with an electro-optic device and a memory. The construction has no particular limitation, but, for example, an integrated circuit (IC) card, a cellular phone, a video camera, a personal computer, a head mounted display, a rear or front projector, further, a fax machine with a display function, a finder of a digital camera, a portable TV, a personal digital assistance (PDA), a personal organizer, an electronic billboard, and a display for advertising are included.

DETAILED DESCRIPTION OF EMBODIMENTS

An exemplary embodiment of the present invention will be described below.

Figure 1:
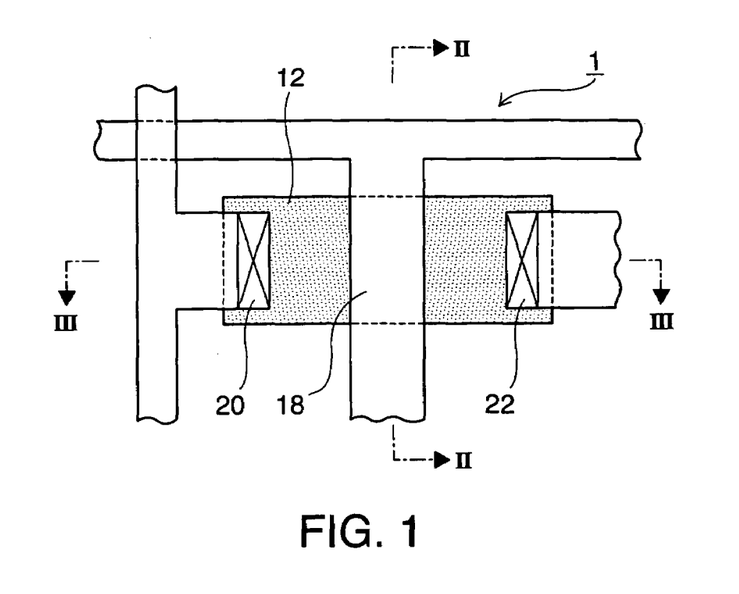
FIG. 1 is a schematic showing the structure of a thin film transistor of the present exemplary embodiment.
Figure 2:
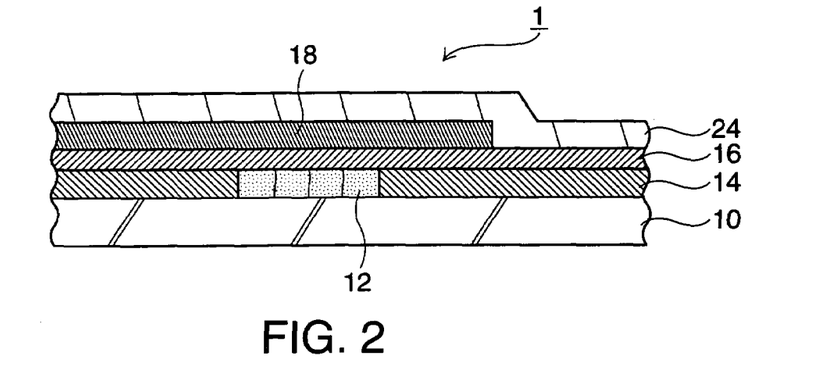
FIG. 2 is a schematic taken on line II-II (in the direction of channel width) of FIG. 1, showing a thin film transistor.
Figure 3:
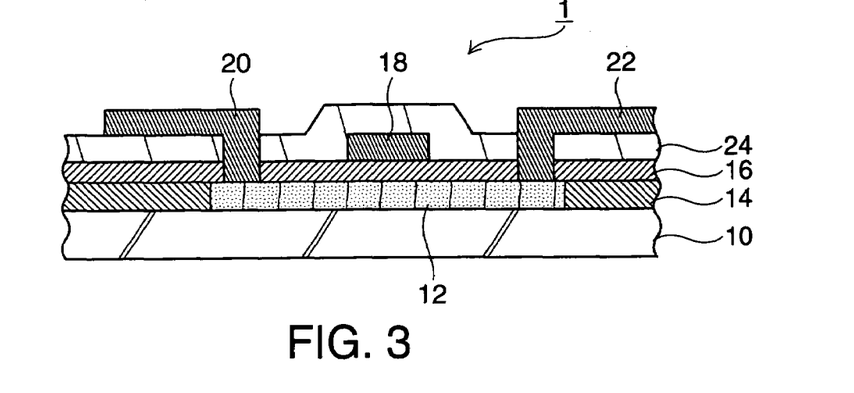
FIG. 3 is a schematic taken on line III-III (in the direction of channel length) of FIG. 1, showing a thin film transistor.

FIG. 1 is a schematic showing the structure of a thin film transistor of the present exemplary embodiment. FIG. 2 is a schematic taken on line II-II (in the direction of channel width) of FIG. 1, showing the thin film transistor. FIG. 3 is a schematic taken on line III-III (in the direction of channel length) of FIG. 1, showing the thin film transistor. The thin film transistor shown in each drawing is used, for example, as a pixel driving element of an organic light emitting diode (OLED) display device, a liquid crystal display, etc.

As shown in FIGS. 1 to 3, a thin film transistor 1 is formed on a substrate (such as a glass substrate) 10 having at least one dielectric surface, and is constructed to include an island-shape semiconductor film 12, a dielectric film (a first dielectric film) 14, a gate dielectric film (a second dielectric film) 16, a gate electrode 18, a source electrode 20, a drain electrode 22, and a dielectric film 24. The thin film transistor 1 of the present exemplary embodiment is an (electric) field effect transistor (FET) using a structure in which a semiconductor film, a dielectric film, and an electrode are deposited, namely an MOS structure.

The semiconductor film 12 functions as an active region of the thin film transistor, and a crystalline semiconductor film is used for it. In the present exemplary embodiment, a polysilicon film is used as the semiconductor film 12.

The dielectric film 14 is formed on one surface of the substrate 10 so as to enclose the semiconductor film 12 and expose the top surface of the semiconductor film 12. This dielectric film 14 is formed to have nearly the same film thickness as the semiconductor film 12. The top surface of the dielectric film 14 and the top surface of the semiconductor film 12 are formed to be flush with each other such that they form substantially the single surface. A silicon oxide ($SiO_2$) film, a silicon nitride ($Si_3N_4$) film, or a phospho-silicate glass (PSG) film, for example, is preferably used as the dielectric film 14. Although the details will be described below, in the present exemplary embodiment, on one hand it is necessary that the dielectric film 14 is formed to be a considerably thick film, but on the other hand the dielectric film 14 is not so necessarily required to have characteristics such as isolation voltage and fixed charge density as the gate dielectric film 16. A manufacturing conditions suitable for high-rate film formation is therefore employed to form the dielectric film 14.

The gate dielectric film 16 is formed on the dielectric film 14 to cover the top surface of the semiconductor film 12. A silicon oxide ($SiO_2$) film, a silicon nitride ($Si_3N_4$) film, or a phospho-silicate glass (PSG) film, for example, is also preferably used as the gate dielectric film 16. Although the details will be described below, there is little necessity for forming the dielectric film 16 to be a thick film, but the dielectric film 16 is demanded to have a high degree of characteristics for isolation voltage, fixed charge density, etc. Manufacturing conditions (generally, slow film formation) on which better film quality can be obtained is therefore employed to form the dielectric film 16.

The gate electrode 18 is formed to be above the dielectric film 14 and on the gate dielectric film 16 and pass over a predetermined location of the semiconductor film 12. In detail, the gate electrode 18 is formed to cross the two parallel sides of the semiconductor film 12 as shown in FIG. 1 or FIG. 2. This gate electrode 18 is a conductor film made of tantalum, chromium, aluminum, etc.

Both the source electrode 20 and the drain electrode 22 separately pass through the dielectric film 24 and gate dielectric film 16 to be connected to the semiconductor film 12. These source electrode 20 and the like are conductor films made of, for example, aluminum.

The dielectric film 24 is formed on the gate dielectric film 16 to cover the top surface of the gate electrode 18 and the like. A silicon oxide ($SiO_2$) film, a silicon nitride ($Si_3N_4$) film, or a phospho-silicate glass (PSG) film, for example, is also preferably used as the gate dielectric films 24.

Although a first dielectric film (dielectric film 14) is formed to expose the top surface of the semiconductor film 12 in the thin film transistor shown in FIGS. 1 to 3, the first dielectric film may be formed not to expose the top surface of the semiconductor film 12.

Figure 4:
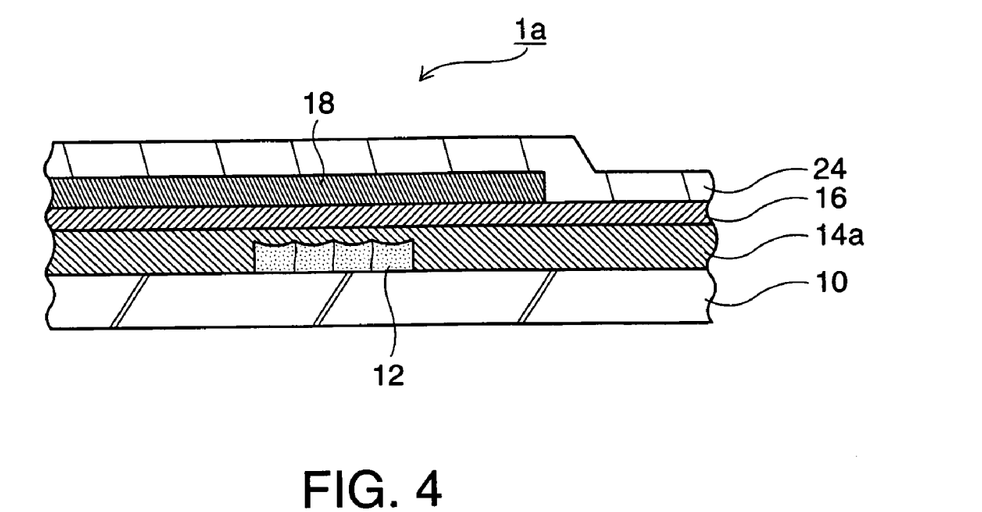
FIG. 4 is a schematic showing the structure of a thin film transistor when not to expose the top surface of a semiconductor film.
Figure 5:
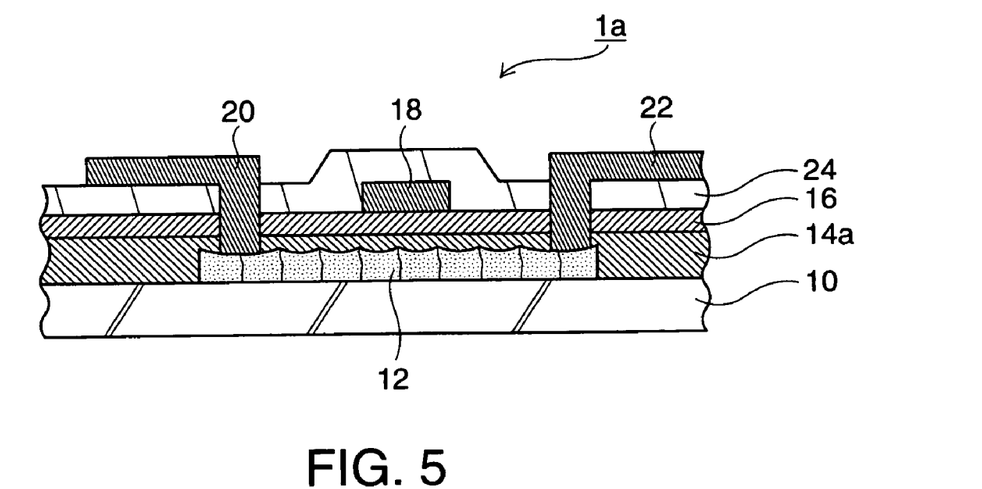
FIG. 5 is a schematic showing the structure of a thin film transistor when not to expose the top surface of a semiconductor film.

FIGS. 4 and 5 are schematics showing the structure of a thin film transistor when not to expose the top surface of the semiconductor film 12. FIG. 4 shows a section in the same direction as the above FIG. 2, and FIG. 5 shows a section in the same direction as the above FIG. 3, respectively. The planar arrangement of the thin film transistor is similar to that in the above FIG. 1, and therefore is not shown.

A thin film transistor 1a shown in FIGS. 4 and 5 has basically the same construction as the above described thin film transistor 1, but has a different construction for a dielectric film 14a functioning as a first dielectric film from the thin film transistor 1. The dielectric film 14a in the present exemplary embodiment is formed to cover the semiconductor film 12 and have a first film thickness, which corresponds to the region other than over the semiconductor film 12, equal to or larger than the film thickness of the semiconductor film 12, as well as a second film thickness, which corresponds to the region over the semiconductor film 12, smaller than the first film thickness. In other words, the dielectric film 14a is formed such that its portion around the semiconductor film 12 is thick and the portion on the top surface of the semiconductor film 12 is thin. The gate dielectric film 16 as a second dielectric film is formed on the dielectric film 14a, and a gate electrode is formed on the upper side of the gate dielectric film 16. In theory, it is possible to construct the thin film transistor 1a such that this gate dielectric film 16 as a second dielectric film is omitted and the dielectric film 14a has the function as a gate dielectric film in addition to the function as a first dielectric film.

The thin film transistor of the present exemplary embodiment has such a construction, and then a preferable example of the method for manufacturing the thin film transistor will be explained.

FIGS. 6A to 7F are schematics showing a manufacturing method of the thin film transistor 1. FIGS. 6A to 6F show sectional views in the same direction as the above FIG. 2, and FIGS. 7A to 7F show sectional views in the same direction as the above FIG. 3.

(Semiconductor Film Formation Process)

Figure 6A:
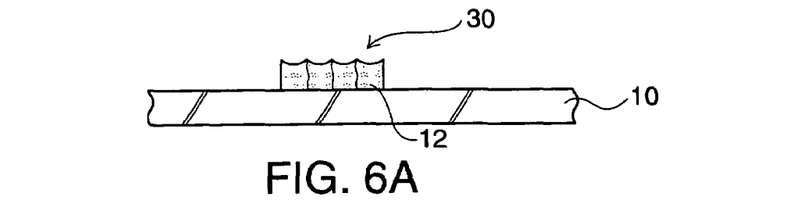
FIGS. 6A to 6F are schematics showing a manufacturing method of a thin film transistor.
Figure 7A:
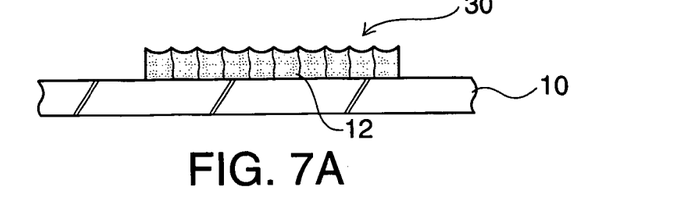
FIGS. 7A to 7F are schematics showing a manufacturing method of a thin film transistor.

As shown in FIGS. 6A and 7A, an island-shape semiconductor film 12 is formed on the substrate 10. For example, an amorphous silicon film is formed over substantially the entire upper surface of the substrate 10 by using a film formation method such as a plasma-enhanced chemical vapor deposition (PECVD) method, a low pressure chemical vapor deposition (LPCVD) method, an atmospheric pressure chemical vapor deposition (APCVD) method, and a sputtering method. This amorphous silicon film is irradiated with excimer laser beams (laser annealing) so that the amorphous silicon film is converted into a polysilicon film. Then patterning by photolithography and etching is performed, obtaining the island-shape semiconductor film 12 made of a polysilicon film. At this time, unevenness 30 by a rise of a boundary between crystal grains (a grain boundary) often occurs in the surface of the polysilicon film obtained by crystallization using laser irradiation.

(First Dielectric Film Formation Process)

Figure 6B:
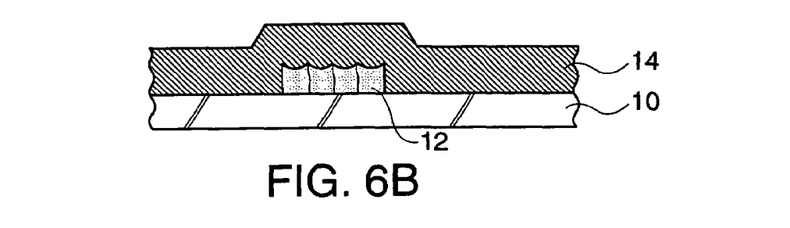
Figure 7B:
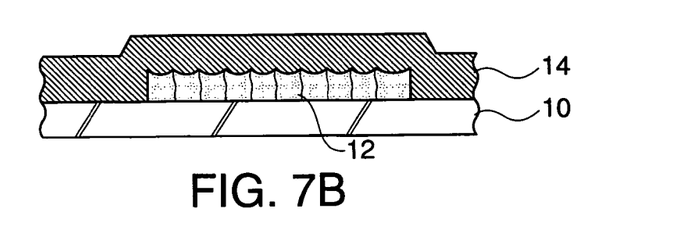

As shown in FIGS. 6B and 7B, the dielectric film 14 is formed on one surface of the substrate 10 so as to cover the semiconductor film 12 and have the film thickness of the region other than over the semiconductor film 12 that is equal to or larger than the film thickness of the semiconductor film 12. As described above, the conditions on which the film can be formed to be thick for a considerably short time is employed to form the dielectric film 14 in the present exemplary embodiment. As such a high-rate film formation method, for example, a technique in which a liquid material is applied onto substantially the entire surface of the substrate 10 by the spin coating method and then the applied liquid material is baked to solidify can be adopted. For example, a solution obtained by dissolving polysilazane (such as perhydropolysilazane) into an organic solvent (such as 20% xylen solution) is used as a liquid material, the liquid material is applied onto the substrate by a spin coating method (for example, at 2000 rpm for 20 seconds), and then the applied liquid material is baked in the atmospheric air at the temperature around 450 degrees Celsius, thereby obtaining a silicon oxide film that is a thick film. "Perhydropolysilazane" described above is one type of inorganic polysilazane, which is converted into a silicon oxide film by the baking in the atmospheric air. A silicon oxide film may be obtained by dropping a suitable amount of photosensitive polysilazane as a liquid material onto the substrate 10 and then applying it by a spin coating method (for example, at 1000 rpm for 20 seconds), and baking it at around 100 degrees Celsius.

High-rate film formation of a dielectric film by other techniques than the above-described technique using a liquid material is possible. For example, film formation can be performed by applying a CVD method. When a CVD method is used, a PECVD method is particularly preferable; the following conditions for film formation are applicable. For example, setting the conditions that tetraethoxysilane (TEOS) and oxygen ($O_2$) are used as raw material gas and their flow rates are 200 sccm and 5 slm respectively, an atmosphere temperature is 350 degrees Celsius, RF power is 1.3 kW, and pressure is 200 Pa enables formation of a silicon oxide film at the high speed of around 300 nm/min. Setting the conditions that monosilane ($SiH_4$), nitrous oxide ($N_2O$), and argon (Ar) are used as raw material gas and their flow rates are 160 sccm, 3 slm, and 5 slm respectively, an atmosphere temperature is 400 degrees Celsius, RF power is 800 W, and pressure is 170 Pa also enables formation of a silicon oxide film at the high speed of around 300 nm/min. As a dielectric film, a silicon nitride film (SiN) may be used.

(Film Thickness Reduction Process)

Figure 6C:
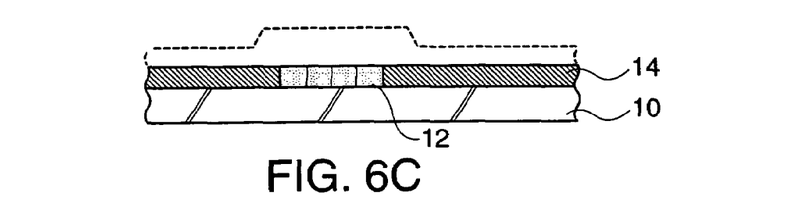
Figure 7C:
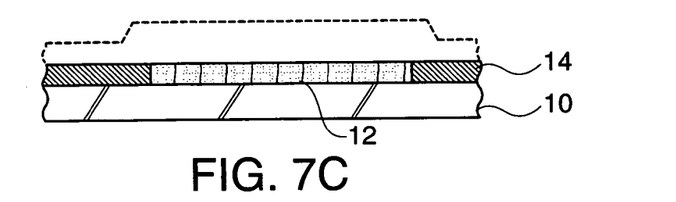

As shown in FIG. 6C and FIG. 7C, the dielectric film 14 is polished until the top surface of the semiconductor film 12 is exposed and the unevenness 30 of the surface is planarized, thereby reducing the film thickness. In the present exemplary embodiment, chemical mechanical polishing (a CMP method) is adopted to perform this process. As a result, the top surface of the dielectric film 14 has the same height as the top surface of the semiconductor film 12 as shown in the drawings, thereby obtaining the surface with high planarization. As preferable conditions for polishing by a CMP method, for example, the conditions can be adopted as follows: a combination of a pad made of flexible polyurethane and a polishing agent (slurry) in which silica particles are distributed in an ammoniacal or aminic alkali solution is used; pressure is 30000 Pa; a rotational speed is 50 rpm; and a flow rate of the polishing agent is 200 sccm.

When manufacturing the above described thin film transistor 1a shown in FIGS. 4 and 5, it is recommended in this process that the dielectric film 14 be polished to reduce its film thickness so that at least the region over semiconductor film 12 of the dielectric film 14a has a desired film thickness (a preferable film thickness as a gate dielectric film) as well as not to expose the top surface of the semiconductor film 12.

(Second Dielectric Film Formation Process)

Figure 6D:
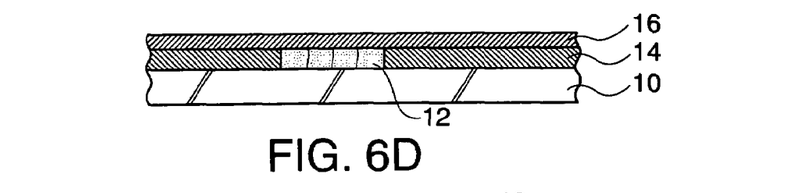
Figure 7D:
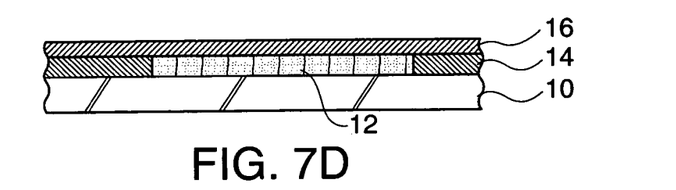

As shown in FIGS. 6D and 7D, the gate dielectric film 16 is formed such that the top surface of the exposed semiconductor film 12 is covered. For example, the gate dielectric film 16 made of a silicon oxide film is formed by a PECVD method. Specifically, a silicon oxide film is formed by setting the conditions as follows: tetraethoxysilane (TEOS) and oxygen ($O_2$) are used as raw material gas and their flow rates are 50 sccm and 5 slm respectively; an atmosphere temperature is 350 degrees Celsius; RF power is 1.3 kW; and pressure is 200 Pa. In this case, the speed of formation is around 30 nm/min, and therefore a good silicon oxide film having a breakdown voltage characteristic and other characteristics suitable for a gate dielectric film can be obtained.

(Electrode Formation Process)

Figure 6E:
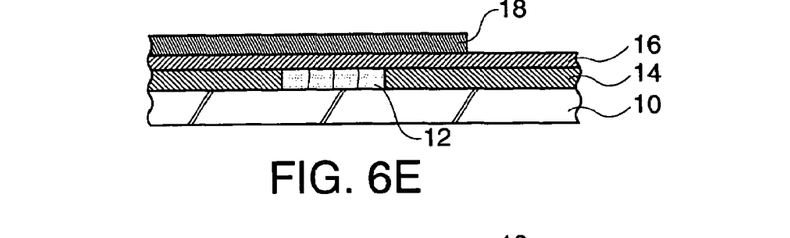
Figure 7E:
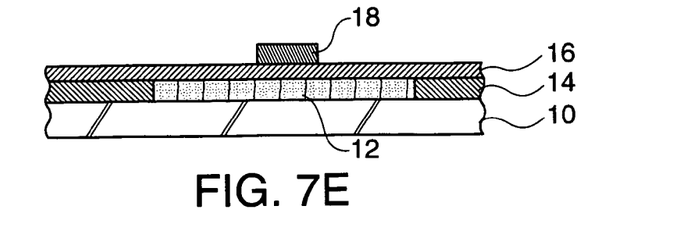

As shown in FIGS. 6E and 7E, a metal thin film made of tantalum, aluminum, etc., is formed by a sputtering method and then patterning is performed, thereby forming the gate electrode 18 at a predetermined location on the gate dielectric film 16.

In the above described thin film transistor 1a shown in FIGS. 4 and 5, if, furthermore, a gate dielectric film as a second dielectric film is omitted, the gate electrode 18 is formed at a predetermined location on the dielectric film 14a as a first dielectric film.

(Source Electrode and Drain Electrode Formation Process)

Figure 6F:
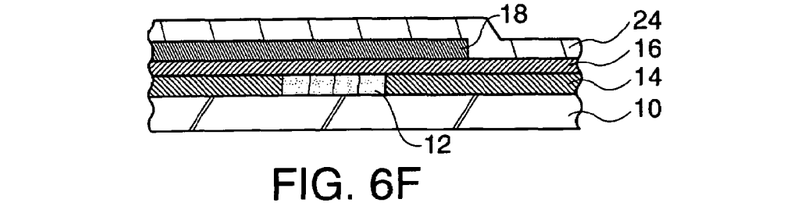
Figure 7F:
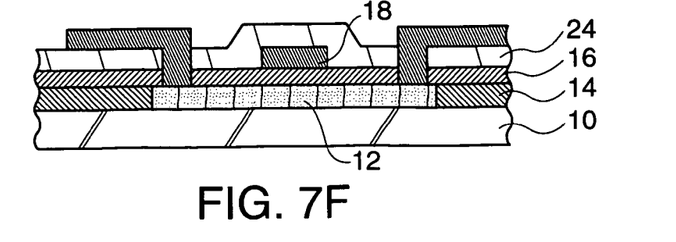

Then impurity ions, which will be donors or acceptors, are implanted into the semiconductor film 12 by using the gate electrode 18 as a mask. As a result, a channel formation region is formed under the gate electrode 18, and a source or drain region is formed in the other portion (the portion where the ions are implanted). If an n-channel metal-oxide semiconductor (NMOS) transistor is manufactured, for example, phosphorus (P) is doped into the source or drain region as an impurity element with a concentration of $1\times10^{16}$ cm$^{-2}$. Then activation of the impurity element is performed by irradiation of XeCl excimer laser with an irradiation energy density of around 200 to 400 mJ/cm$^2$ or thermal treatment at the temperature of around 250 to 450 degrees Celsius. Then, as shown in FIGS. 6F and 7F, the dielectric film 24 is formed on the top surface of the dielectric film 16 and the gate electrode 18. As the dielectric film 24, for example, a silicon oxide film of around 500 nm is formed by a PECVD method. Contact holes that pass through the dielectric films 16 and 24 to reach the source or drain region of the semiconductor film 12 are formed, and the source electrode 20 and the drain electrode 22 are formed in the contact holes and on the dielectric film 24. Depositing aluminum by a sputtering method and then patterning, for example, can form the source electrode 20 and the drain electrode 22.

Through the above processes, the field effect thin film transistor 1 (or 1a) using the MOS structure in which a semiconductor film, a dielectric film, and an electrode are deposited can be obtained.

Thus, the present exemplary embodiment makes it possible to avoid the concentration of the electric field at the edge of the semiconductor film without damaging necessary characteristics as a field effect thin film transistor, thereby enhancing the reliability.

Next, another practical example of a method for manufacturing a semiconductor device of exemplary embodiment of the present invention (manufacturing method of a transistor) will be described with reference to FIGS. 8A-D. In FIGS. 8A-D, the portions corresponding to those in FIG. 6 are denoted with the same numerals as used in FIG. 6.

In this practical example, an element isolation region is formed with a dielectric film on a dielectric substrate, and then a semiconductor film is formed. Performing the etchback process of this semiconductor film forms the top surface of the semiconductor film and the top surface of the dielectric film in the element isolation region to be substantially the single surface (flush with each other). Thus there is no exposure of the edge of the semiconductor film and a gate dielectric film is formed not to bend (planar) at the edge of the semiconductor film.

(Dielectric Film Formation Process)

Figure 8A:
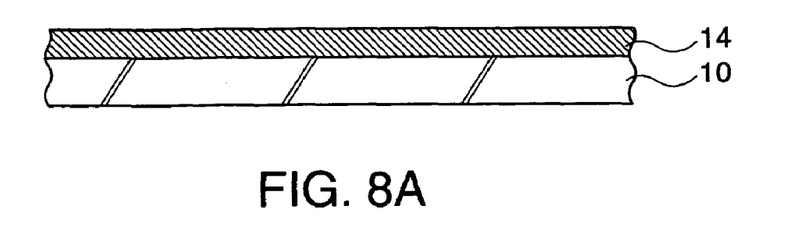
FIGS. 8A to 8D are schematics showing a manufacturing method of a thin film transistor.

As shown in FIG. 8A, the dielectric film 14 is formed on the substrate 10. As described above, if the conditions on which a film can be formed to be thick for a considerably short time is adopted, for example, a technique in which a liquid material is applied onto substantially the entire surface of the substrate 10 by the spin coating method and then the applied liquid material is baked to solidify can be adopted. For example, a solution obtained by dissolving polysilazane (such as perhydropolysilazane) into an organic solvent (such as 20% xylen solution) is used as a liquid material, the liquid material is applied onto the substrate by a spin coating method (for example, at 2000 rpm for 20 seconds), and then the applied liquid material is baked in the atmospheric air at the temperature around 450 degrees Celsius, thereby obtaining a silicon oxide film that is a thick film. "Perhydropolysilazane" described above is one type of inorganic polysilazane, which is converted into a silicon oxide film by the baking in the atmospheric air. A silicon oxide film may be obtained by dropping a suitable amount of photosensitive polysilazane as a liquid material onto the substrate 10 and then applying it by a spin coating method (for example, at 1000 rpm for 20 seconds), and baking it at around 100 degrees Celsius.

High-rate film formation of a dielectric film by techniques other than the technique using the above-described liquid material is possible. For example, film formation can be performed by applying a CVD method. When a CVD method is used, a PECVD method is particularly preferable; the following conditions for film formation are applicable. For example, setting the conditions that tetraethoxysilane (TEOS) and oxygen ($O_2$) are used as raw material gas and their flow rates are 200 sccm and 5 slm respectively, an atmosphere temperature is 350 degrees Celsius, RF power is 1.3 kW, and pressure is 200 Pa enables formation of a silicon oxide film at the high speed of around 300 nm/min. Setting the conditions that monosilane ($SiH_4$), nitrous oxide ($N_2O$), and argon (Ar) are used as raw material gas and their flow rates are 160 sccm, 3 slm, and 5 slm respectively, an atmosphere temperature is 400 degrees Celsius, RF power is 800 W, and pressure is 170 Pa also enables formation of a silicon oxide film at the high speed of around 300 nm/min. As a dielectric film, a silicon nitride film (SiN) may be used.

Figure 8B:
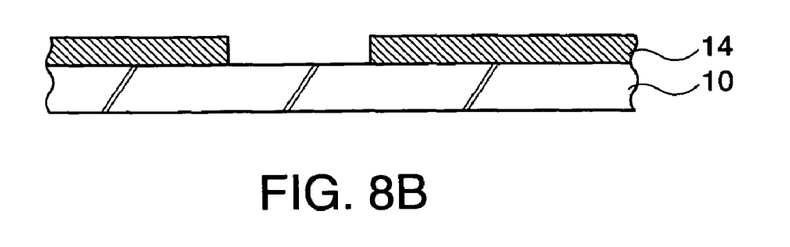

Then, as shown in FIG. 8B, the dielectric film 14 formed on the substrate 10 is etched by using a mask for opening a semiconductor formation region, and therefore the dielectric film 14 is opened such that the semiconductor formation region (element formation region) is exposed on the substrate 10. The dielectric film 14 becomes an element isolation film.

(Semiconductor Film Formation Process)

Figure 8C:
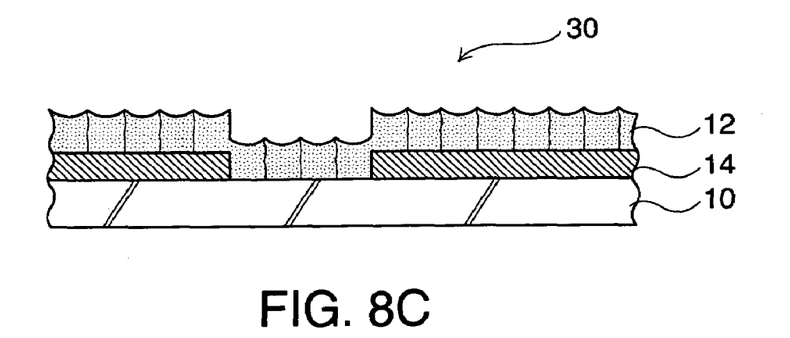

As shown in FIG. 8C, the semiconductor film 12 is formed on the top surface of the dielectric film 14 and in the semiconductor formation region opened in the dielectric film 14 on the substrate 10 such that the semiconductor form region opened in the dielectric film 14 is buried with the semiconductor film 12. As described above, for example, an amorphous silicon film is formed over substantially the entire upper surface of the substrate 10 by using a film formation method such as a PECVD method, a LPCVD method, an APCVD method, and a sputtering method. This amorphous silicon film is irradiated with excimer laser beams (laser annealing) so that the amorphous silicon film is converted into a polysilicon film. The unevenness 30 by a rise of a boundary between crystal grains (a grain boundary) often occurs in the surface of the polysilicon film obtained by crystallization using laser irradiation.

(Film Thickness Reduction Process)

Figure 8D:
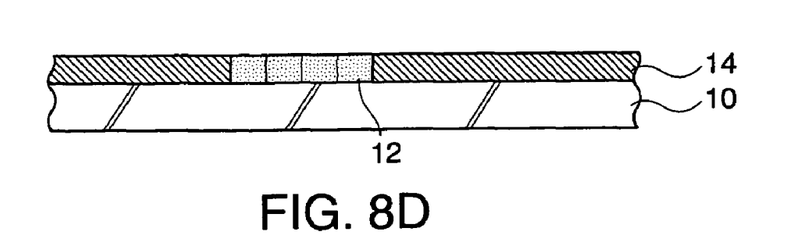

As shown in FIG. 8D, the dielectric film 14 is polished until the top surface of the semiconductor film 12 is exposed and the unevenness 30 of the surface is planarized, thereby reducing the film thickness. In the present exemplary embodiment, chemical mechanical polishing (a CMP method) is adopted to perform this process. As a result, the top surface of the dielectric film 14 has the same height as the top surface of the semiconductor film 12 as shown in the drawings, thereby obtaining the surface with high planarization. As preferable conditions for polishing by a CMP method, for example, the conditions can be adopted as follows: a combination of a pad made of flexible polyurethane and a polishing agent (slurry) in which silica particles are distributed in an ammoniacal or aminic alkali solution is used, pressure is 30000 Pa, a rotational speed is 50 rpm, and a flow rate of the polishing agent is 200 sccm.

This process is followed by the second dielectric film (gate dielectric film) formation process, the gate electrode formation process, the source electrode and drain electrode formation process, and the protective film (dielectric film) formation process, as shown in FIGS. 6D to 6F, which manufactures a semiconductor device (transistor).

The semiconductor film is not restricted to a silicon film. The semiconductor film formation process may be one by the use of liquid silicon.

Thus, the present exemplary embodiment can planarize the semiconductor film 12 and the gate dielectric film 16 and reduce or eliminate the portions where an electric field concentrates in the semiconductor film and the gate dielectric film, and therefore transistor characteristics are enhanced. It is advantageous that using a process with low step coverage for formation of a gate dielectric film also becomes possible.

Next, concrete examples of an integrated circuit, an electro-optic device, and electronic equipment constructed to include the above described semiconductor device will be described.

Figure 9:
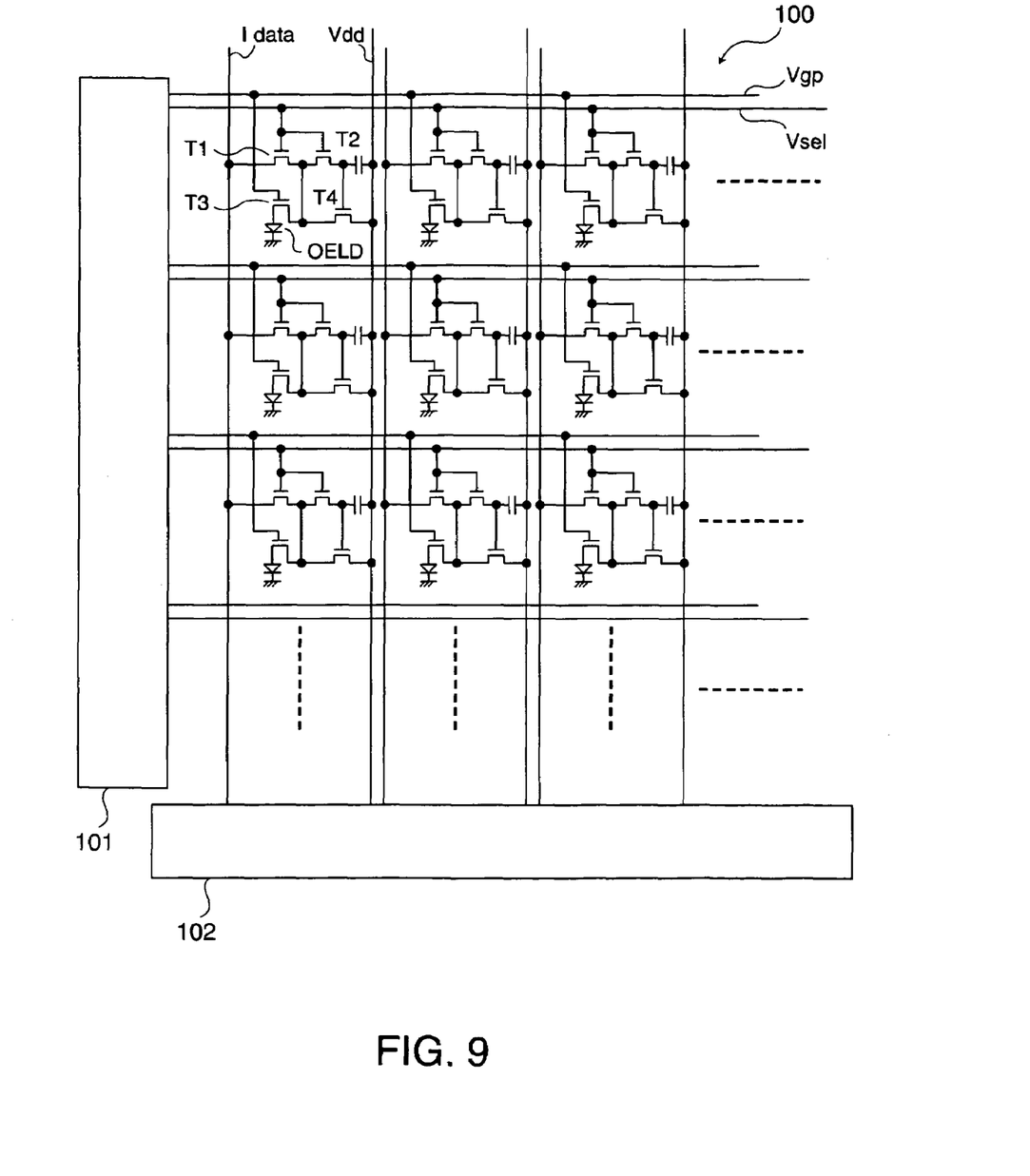
FIG. 9 is a schematic circuit diagram of an electro-optic device constructed to include a semiconductor device.

FIG. 9 is a schematic showing an electro-optic device 100 constructed to include a semiconductor device. The electro-optic device (display device) 100 of the present exemplary embodiment includes a light emitting layer, namely an organic light emitting diode (OLED), which can emit light due to electroluminescence, and the holding capacity to store the current for driving the light emitting layer in each pixel region, and further includes semiconductor devices (thin film transistors T1 to T4) according to exemplary embodiments of the present invention. From a driver 101, a scanning line Vsel and a light emitting control line Vgp are supplied to each pixel region. From a driver 102, a data line Idata and a power supply line Vdd are supplied to each pixel region. By controlling the scanning line Vsel and the data line Idata, a current program is performed for each pixel region, making it possible to control light emitting by the light emitting portion OLED.

The above driving circuit is one example of circuits when using an electroluminescent device as a light emitting element, and other circuit configurations may be employed. It is also preferable that an integrated circuit constituting each driver 101 or 102 is formed using a semiconductor device according to exemplary embodiments of the present invention.

Figure 10A:
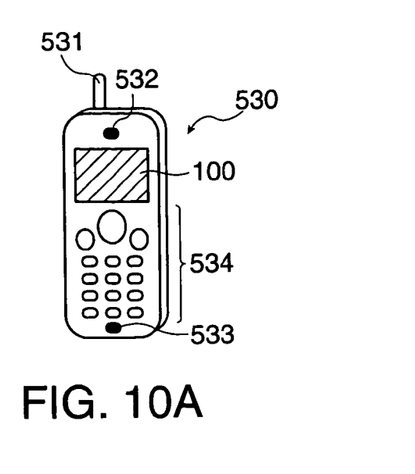
FIGS. 10A to 10D are schematics showing concrete examples of electronic equipment.
Figure 10B:
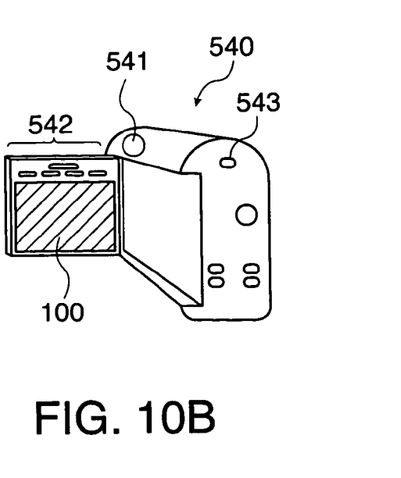
Figure 10C:
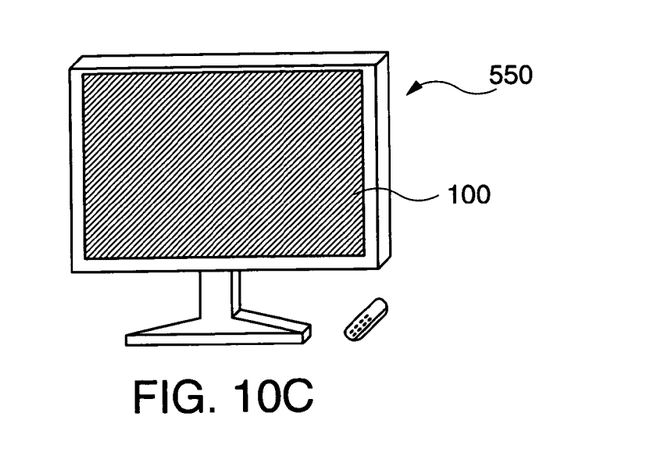
Figure 10D:
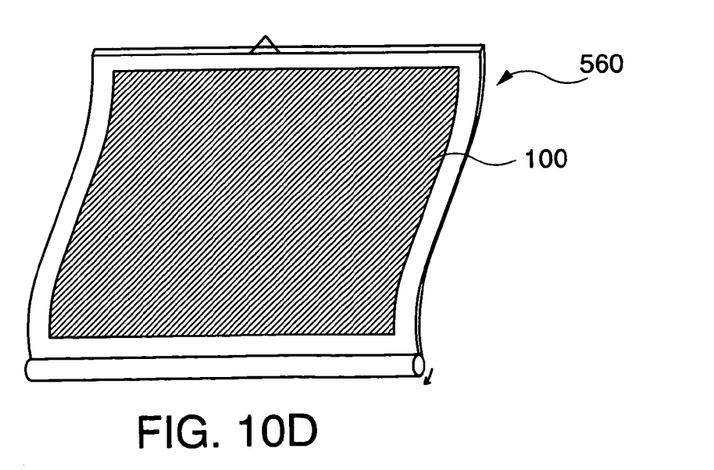

FIGS. 10A to 10D are schematics showing concrete examples of electronic equipment including the above electro-optic device. FIG. 10A is an example of the application to a cellular phone. A cellular phone 530 includes an antenna section 531, a sound output section 532, a sound input section 533, an operation section 534, and the electro-optic device 100 of exemplary embodiments of the present invention. Thus, the electro-optic device according to exemplary embodiments of the present invention can be used as a display section. FIG. 10B is an example of the application to a video camera. A video camera 540 includes a picture reception section 541, an operation section 542, a sound input section 543, and the electro-optic device 100 of exemplary embodiments of the present invention. FIG. 10C is an example of the application to a television. A television 550 includes the electro-optic device 100 of exemplary embodiments of the present invention. An electro-optic device according to exemplary embodiments of the present invention can be similarly applied to a monitor device used for a personal computer. FIG. 10D is an example of the application to a television with a roll up type screen. The television with a roll up type screen 560 includes the electro-optic device 100 of the present invention. Electronic equipment is not restricted to these and the electro-optic device of exemplary embodiments of the present invention can be applied to a variety of electronic equipment having display functions. In addition to these examples, a fax machine with a display function, a finder of a digital camera, a portable television, a personal organizer, an electronic billboard, and a display for advertising, etc., are included. Besides being incorporated to the electronic equipment as a component of an electro-optic device as described above, the semiconductor device according to exemplary embodiments of the present invention is applicable as an individual component of electronic equipment.

The manufacturing method of the semiconductor device according to exemplary embodiments of the present invention is not restricted to the above described examples but is applicable for manufacturing of any electronic equipment. For example, in addition to the above described examples, the method can be applied to a fax machine with a display function, a finder of a digital camera, a portable TV, a PDA, a personal organizer, an electronic billboard, a display for advertising, and an IC card.

Exemplary embodiments of the present invention are not restricted to each exemplary embodiment described above and various exemplary modifications may be practiced within the scope of exemplary embodiments of the present invention.

Although in the above exemplary embodiment, for example, the polysilicon film is taken up as one example of the semiconductor film and described, the semiconductor film is not restricted to this.

Although a thin film transistor is also taken up as one example of a field effect semiconductor device in the above exemplary embodiment, exemplary embodiments of the present invention can be similarly applied to a semiconductor device having a structure of performing element isolation between transistors by etching, etc., in single crystal SOI (silicon on insulator) transistors.

What is claimed is:

1. A method of manufacturing a semiconductor device, comprising:
    first forming a semiconductor film on a surface of a substrate;
    second forming a first dielectric film that covers the semiconductor film, the first dielectric film having a first portion that has a first film thickness and that is formed over the semiconductor film, a second portion that has a second film thickness and that contacts the surface of the substrate, and including applying and solidifying a liquid material to form the first dielectric film;
    third reducing at least the first film thickness of the first dielectric film; and
    fourth forming an electrode above the first dielectric film.

2. The method of manufacturing a semiconductor device according to claim 1, further comprising:
    prior to the fourth forming, a fifth forming a second dielectric film on the first dielectric film,
    the electrode formed by the fourth forming being formed on the second dielectric film.

3. The method of manufacturing a semiconductor device according to claim 2,
    in the third reducing the first film thickness, the first film thickness being reduced to zero such that the surface of the semiconductor film is exposed, and
    the second dielectric film formed by the fifth forming being formed so as to cover the semiconductor film.

4. The method of manufacturing a semiconductor device according to claim 2,
    in the third reducing the first film thickness, the first dielectric film of at least the first portion being planarized during a period in which the third reducing is carried out.

5. The method of manufacturing a semiconductor device according to claim 1, the third reducing being performed by chemical mechanical polishing.

6. The method of manufacturing a semiconductor device according to claim 1, the semiconductor film being a polycrystalline semiconductor film.

* * * * *